(12) United States Patent
Kawagoe et al.

(10) Patent No.: US 10,165,669 B2
(45) Date of Patent: Dec. 25, 2018

(54) WIRING BOARD AND ELECTRONIC DEVICE

(71) Applicant: KYOCERA Corporation, Kyoto (JP)

(72) Inventors: Hiroshi Kawagoe, Kyoto (JP); Yasunori Suda, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 64 days.

(21) Appl. No.: 14/367,885

(22) PCT Filed: Dec. 21, 2012

(86) PCT No.: PCT/JP2012/083340
§ 371 (c)(1),
(2) Date: Jun. 20, 2014

(87) PCT Pub. No.: WO2013/094755
PCT Pub. Date: Jun. 27, 2013

(65) Prior Publication Data
US 2015/0334877 A1 Nov. 19, 2015

(30) Foreign Application Priority Data

Dec. 22, 2011 (JP) .................................. 2011-281721

(51) Int. Cl.
*H05K 1/18* (2006.01)
*H05K 7/20* (2006.01)
(Continued)

(52) U.S. Cl.
CPC ......... *H05K 1/0204* (2013.01); *H01L 25/167* (2013.01); *H05K 1/181* (2013.01);
(Continued)

(58) Field of Classification Search
CPC ..... H05K 1/181; H05K 7/20436; H05K 7/205
(Continued)

(56) References Cited

U.S. PATENT DOCUMENTS 4,831,212 A * 5/1989 Ogata ................... H01L 21/481
174/546
4,886,709 A 12/1989 Sasame et al.
(Continued)

FOREIGN PATENT DOCUMENTS

JP 11-17349 A 1/1999
JP 2005-51088 A 2/2005
(Continued)

OTHER PUBLICATIONS

Internation Search Report dated Feb. 25, 2013 for PCT application No. PCT/JP2012/083340.

*Primary Examiner* — Timothy J Thompson
*Assistant Examiner* — Rhadames Alonzo Miller
(74) *Attorney, Agent, or Firm* — Procopio Cory Hargreaves and Savitch LLP (57) ABSTRACT

A wiring board comprises an insulating substrate; and a heat-transfer member disposed inside the insulating substrate. The insulating substrate comprises an upper surface and a recess formed in the upper surface, the upper surface including a first mounting region for a first electronic component, and a second mounting region for a second electronic component which is provided in the recess. The heat-transfer member is disposed inside the insulating substrate so as to overlap the first mounting region and the second mounting region as seen in a plan view, and, part of the heat-transfer member is exposed in the recess.

9 Claims, 9 Drawing Sheets (51) Int. Cl.
    *H01L 25/16*    (2006.01)
    *H01L 33/64*    (2010.01)
    *H05K 1/02*     (2006.01)

(52) U.S. Cl.
    CPC ......... *H05K 7/205* (2013.01); *H05K 7/20436* (2013.01); *H01L 33/642* (2013.01); *H01L 2224/48091* (2013.01); *H01L 2224/49113* (2013.01); *H01L 2924/181* (2013.01); *H05K 1/0207* (2013.01); *H05K 2201/10106* (2013.01); *H05K 2201/10174* (2013.01); *H05K 2201/10416* (2013.01)

(58) Field of Classification Search
    USPC .......................................... 174/252; 361/709
    See application file for complete search history.

(56) References Cited

U.S. PATENT DOCUMENTS

| | | | | |
|---|---|---|---|---|
| 4,943,470 | A * | 7/1990 | Shiromizu | H01L 21/481 156/89.15 |
| 4,965,659 | A | 10/1990 | Sasame et al. | |
| 5,010,388 | A | 4/1991 | Sasame et al. | |
| 5,132,776 | A | 7/1992 | Hanada et al. | |
| 5,285,352 | A * | 2/1994 | Pastore | H01L 23/36 165/185 |
| 5,731,067 | A * | 3/1998 | Asai | H01L 23/3677 174/252 |
| 5,991,162 | A * | 11/1999 | Saso | H05K 1/0207 257/700 |
| 5,998,043 | A | 12/1999 | Sasaki et al. | |
| 6,914,321 | B2 * | 7/2005 | Shinohara | H01L 23/4334 257/502 |
| 7,122,069 | B2 | 10/2006 | Dorfman et al. | |
| 7,521,863 | B2 * | 4/2009 | Tanda | H01L 33/486 257/10 |
| 7,923,826 | B2 * | 4/2011 | Takahashi | H01L 21/561 257/675 |
| 8,314,346 | B2 * | 11/2012 | Hasegawa | H01L 33/642 174/252 |
| 2002/0060356 | A1 * | 5/2002 | Nishibori | H01L 23/049 257/668 |
| 2002/0191377 | A1 | 12/2002 | Osada et al. | |
| 2003/0207146 | A1 | 11/2003 | Sasaki et al. | |
| 2004/0102023 | A1 * | 5/2004 | Morozumi | H01L 23/3735 438/460 |
| 2004/0246682 | A1 | 12/2004 | Osakada et al. | |
| 2006/0246314 | A1 | 11/2006 | Osada et al. | |
| 2007/0057364 | A1 * | 3/2007 | Wang | C03C 8/02 257/701 |
| 2008/0043444 | A1 * | 2/2008 | Hasegawa | H01L 33/642 361/717 |
| 2009/0020778 | A1 * | 1/2009 | Noichi | H01L 25/167 257/99 |
| 2010/0149756 | A1 | 6/2010 | Roweliffe et al. | |
| 2011/0169037 | A1 * | 7/2011 | Hasegawa | H01L 33/642 257/98 |
| 2011/0198653 | A1 | 8/2011 | Cho | |
| 2011/0220939 | A1 * | 9/2011 | Nakayama | H01L 33/44 257/98 |
| 2011/0317433 | A1 | 12/2011 | Hee et al. | |
| 2014/0000940 | A1 | 1/2014 | Onitsuka et al. | |
| 2014/0196934 | A1 * | 7/2014 | Kawagoe | H05K 1/0209 174/252 |

FOREIGN PATENT DOCUMENTS

| | | | |
|---|---|---|---|
| JP | 2005051088 A | * | 2/2005 |
| JP | 2006-66409 A | | 3/2006 |
| JP | 2008-85296 A | | 1/2008 |
| JP | 2009-44116 A | | 2/2009 |

* cited by examiner

WIRING BOARD AND ELECTRONIC DEVICE

TECHNICAL FIELD

The present invention relates to a wiring board and an electronic device.

BACKGROUND ART

As a wiring board designed for the mounting of an electronic component (for example, a light-emitting element such as a light-emitting diode), for example, as disclosed in Patent Literature 1 set forth hereunder, there is proposed a construction having a heat-transfer member disposed so as to extend from an upper surface to a lower surface of an insulating substrate. An electronic component is mounted on an upper part of the heat-transfer member, so that heat generated by the electronic component is transmitted to the mounting board via the heat-transfer member.

Moreover, there is proposed an electronic device having a plurality of electronic components (for example, a light-emitting element and a protection element) in which part of the plural electronic components (for example, a protection element) is housed in a recess of an insulating substrate.

CITATION LIST

Patent Literature

Patent Literature 1: Japanese Unexamined Patent Publication JP-A 2006-66409
Patent Literature 2: Japanese Unexamined Patent Publication JP-A 2008-85296

SUMMARY OF INVENTION

Technical Problem

The construction having the heat-transfer member as above described is capable of achieving improvement in heat dissipation, but, on the other hand, there still remains a problem in the structure wherein part of the plural electronic components is housed in the recess in that heat confinement in the recess occurs. Heat confinement in the recess may lead to the possibility of deterioration in the operation characteristics of the electronic component housed in the recess.

Solution to Problem

According to one aspect of the invention, a wiring board comprises an insulating substrate; and a heat-transfer member disposed inside the insulating substrate. The insulating substrate has an upper surface and a recess formed in the upper surface, the upper surface including a first mounting region for a first electronic component, and a second mounting region for a second electronic component which is provided in the recess. The heat-transfer member is disposed inside the insulating substrate so as to overlap the first mounting region and the second mounting region as seen in a plan view, and, part of the heat-transfer member is left exposed in the recess.

According to another aspect of the invention, an electronic device comprises the wiring board having the above-described constitution; a first electronic component disposed on the first mounting region of the wiring board; and a second electronic component disposed on the second mounting region of the wiring board.

Advantageous Effects of Invention

In the wiring board according to one aspect of the invention, since the heat-transfer member is disposed inside the insulating substrate so as to overlap the first mounting region and the second mounting region as seen in a plan view, and part of the heat-transfer member is left exposed in the recess, it is possible to eliminate heat in the recess in an efficient manner, and thus implement an electronic device in which the operation characteristics of the second electronic component disposed inside the recess can be improved.

In the electronic device according to another aspect of the invention, since the electronic device includes the wiring board having the above-described structure, it is possible to suppress heat confinement in the recess, and thereby achieve improvement in operation characteristics.

DESCRIPTION OF EMBODIMENTS

Hereinafter, an exemplificative embodiment of the invention will be described with reference to the drawings.

An electronic device in accordance with the present embodiment is concerned with a light-emitting device or the like having an electronic component such for example as a light-emitting diode (LED).

Figure 1:
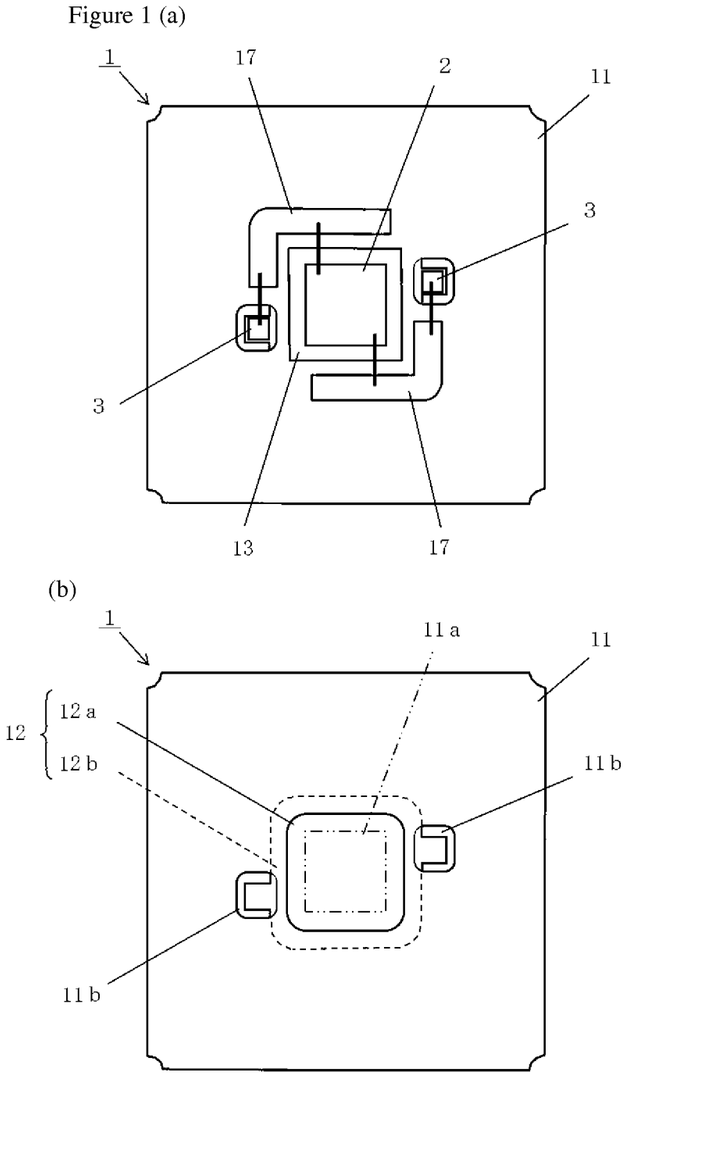
FIG. 1(a) is a plan view of an electronic device in accordance with an embodiment of the invention.
FIG. 1(b) is a plan view showing the structure of the electronic device as shown in FIG. 1(a), with first and second electronic components, top-side heat-transfer layer, top-side wiring conductor, and bonding wires omitted.
Figure 2:
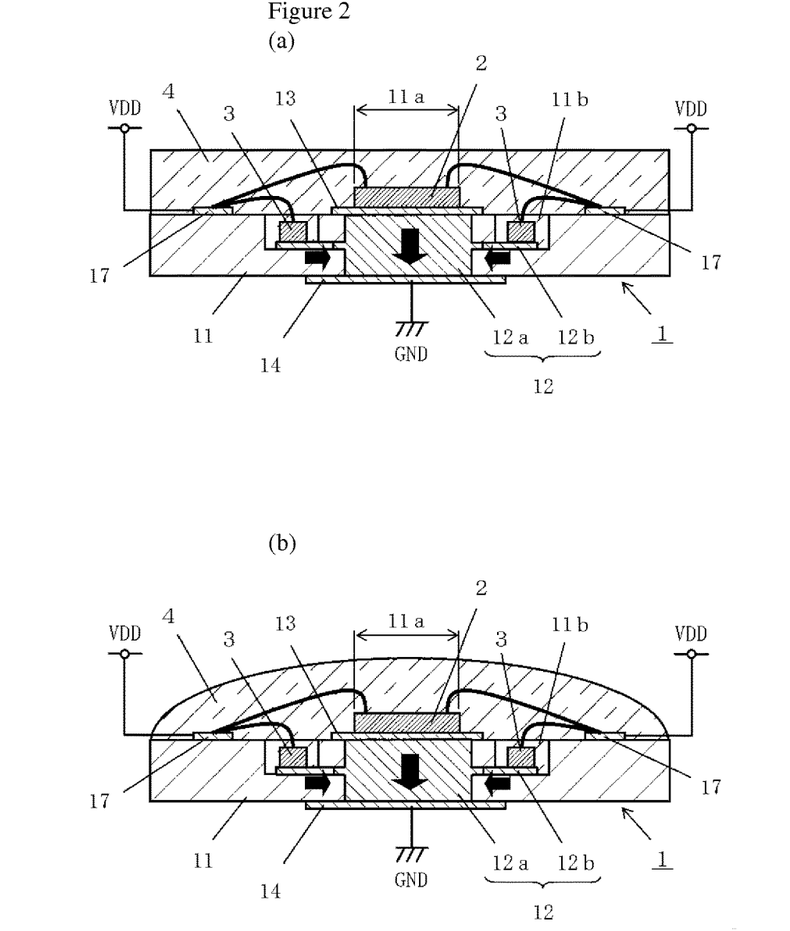
FIG. 2(a) is a schematic longitudinal sectional view of the electronic device as shown in FIG. 1(a) and FIG. 1(b)
FIG. 2(b) is a schematic longitudinal sectional view related to another example of the electronic device as shown in FIG. 2(a)

As shown in FIG. 1(a), FIG. 1(b), and FIG. 2(a), the electronic device in accordance with this embodiment comprises a wiring board 1, and a first electronic component 2 and a second electronic component 3 which are mounted on the wiring board 1. In the embodiment as shown in FIG. 1(a) to FIG. 2(a), the electronic device includes a plurality of second electronic components 3. Note that the first electronic component 2 is a light-emitting element such for example as a light-emitting diode (LED), and the second electronic component 3 is a protection element such for example as a Zener diode.

Moreover, when there is a need to provide protection for the first electronic component 2 and so forth, the electronic device further comprises a cover member 4. In FIG. 1(a) and FIG. 1(b), the diagrammatic representation of the cover member 4 is omitted.

The wiring board 1 comprises: an insulating substrate 11; a heat-transfer member 12 disposed inside the insulating substrate 11; a top-side heat-transfer layer 13 disposed on an upper surface of the insulating substrate 11; and a bottom-side heat-transfer layer 14 disposed on a lower surface of the insulating substrate 11 (hereafter also referred to as "first bottom-side heat-transfer layer 14").

The insulating substrate 11, which is made of an insulating material such for example as ceramics or resin, has an upper surface and a recess 11b formed in the upper surface, and has, at the upper surface, a first mounting region 11a for the first electronic component 2 (hereafter also referred to simply as "mounting region 11a"), and also has, inside the recess 11b, a second mounting region for the second electronic component 3. In FIG. 1(b), the mounting region 11a is imaginarily represented by a chain double-dashed line.

The recess 11b is intended to cause a difference in mounting heights between the first electronic component 2 and the second electronic component 3 so that, for example, where the first electronic component 2 is a light-emitting element, the second electronic component 3 will not hinder the travel of light emitted from the first electronic component 2.

The recess 11b is located in an area around the mounting region 11a. The placement of the recess 11b in the vicinity of the mounting region 11a helps facilitate wiring design for the first electronic component 2 and the second electronic component 3.

The wiring board 1 further comprises a top-side wiring conductor 17 disposed on the upper surface of the insulating substrate 11. In the embodiment as shown in FIG. 1 and FIG. 2, the wiring board 1 includes a plurality of top-side wiring conductors 17, and the plural top-side wiring conductors 17 are disposed in the area around the mounting region 11a so as to surround the first mounting region 11a for the first electronic component 2.

The top-side wiring conductor 17 is used for supplying a reference voltage to the first electronic component 2 and the second electronic component 3. The reference voltage is, for example, power-supply voltage VDD or ground voltage GND, and, in FIG. 2(a), the supply of power-supply voltage VDD is schematically illustrated. The first electronic component 2 and the second electronic component 3 are electrically connected to the top-side wiring conductor 17 by means of bonding wires, for example.

The heat-transfer member 12 contains a metal material such for example as copper tungsten (CuW). The heat-transfer member 12 serves also as a wiring conductor for supplying a reference voltage to the first electronic component 2 and the second electronic component 3. The reference voltage is, for example, power-supply voltage VDD or ground voltage GND, and, in FIG. 2(a), the supply of ground voltage GND is schematically illustrated.

As shown in FIG. 1(b), the heat-transfer member 12 is placed so as to overlap the mounting region 11a and the recess 11b as seen in a plan view. In FIG. 1(b), there is shown the structure of the wiring board 1, with the top-side heat-transfer layer 13 and the top-side wiring conductor 17 omitted, and, part of the heat-transfer member 12 which is covered with the insulating substrate 11 is indicated by a broken line.

It is sufficient that the heat-transfer member 12 overlaps the recess 11b to an extent that would permit the mounting of the second electronic component 3; that is, the heat-transfer member 12 does not necessarily have to overlap the entire area of the recess 11b. In the embodiment as shown in FIG. 1(b), the heat-transfer member 12 overlaps part of the recess 11b.

Part of the heat-transfer member 12 is exposed out of the insulating substrate 11 in the recess 11b. Hereinafter, the part of the heat-transfer member 12 which is exposed out of the insulating substrate 11 will also be referred to as "exposed part". The second electronic component 3 is electrically connected to the heat-transfer member 12 in the exposed part, so that a reference voltage is fed to the second electronic component 3 through the exposed part.

The heat-transfer member 12 comprises a heat-transfer base portion 12a placed so as to overlap the mounting region 11a as seen in a plan view, and a heat-transfer branch portion 12b disposed so as to extend from the recess 11b to the heat-transfer base portion 12a.

For example, the heat-transfer base portion 12a is so disposed as to extend from the upper surface to the lower surface of the insulating substrate 11. Alternatively, as shown in FIG. 3, the heat-transfer base portion 12a may be embedded in the insulating substrate 11, so that the upper surface and the lower surface of the heat-transfer base portion 12a can be covered with the insulating substrate 11.

Figure 3:
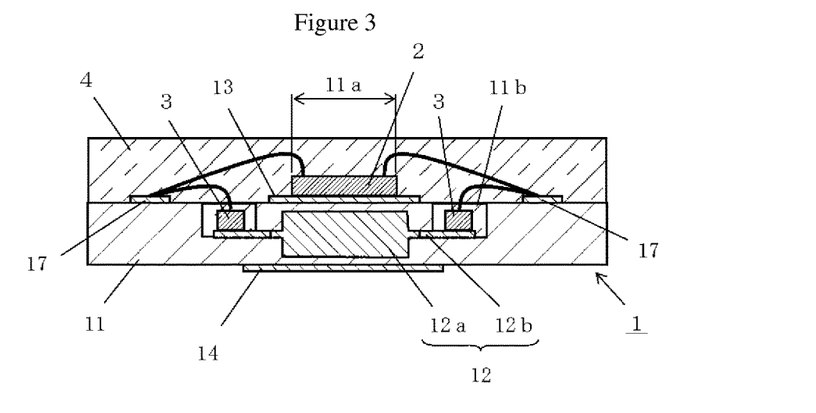
FIG. 3 is a schematic longitudinal sectional view related to another example of the electronic device as shown in FIG. 2.

In this structure as shown in FIG. 3, since the heat-transfer member 12 cannot be used as a path for the supply of reference voltage, it is necessary to supply a reference voltage to the first electronic component 2 and the second electronic component 3 by another way such for example as the provision of a wiring conductor for the supply of reference voltage.

Referring to FIG. 1(a) to FIG. 2(a) once again, where the heat-transfer base portion 12a has an upper surface whose size is larger than the size of the mounting region 11a (or equivalently, the size of the first electronic component 2) as seen in a plan view, it is possible to improve the planarity of the part where the first electronic component 2 is to be mounted. The planarity improvement allows, where, for example, the first electronic component 2 is a light-emitting element, a lessening of unevenness in intensity distribution of light emitted from the first electronic component 2, with the consequence that the wiring board 1 is capable of implementation of an electronic device having improved light emission characteristics.

Moreover, where the heat-transfer base portion 12a has an upper surface whose size is larger than the size of the mounting region 11a (or equivalently, the size of the first electronic component 2) as seen in a plan view, heat generated by the first electronic component 2 is easy to be conducted in a horizontal direction on the upper surface of the wiring board 1, and thereby the heat dissipation efficiency of the first electronic component 2 is increased.

Part of the heat-transfer branch portion 12b is exposed out of the insulating substrate 11 in the recess 11b. In FIG. 1(b), part of the heat-transfer branch portion 12b is illustrated as being seen through the insulating substrate 11 by a broken line. Hereinafter, that part of the heat-transfer branch portion 12b which is exposed out of the insulating substrate 11 will also be referred to as "exposed part". The second electronic component 3 is mounted on the exposed part, and is electrically connected to the heat-transfer branch portion 12b in the exposed part, so that a reference voltage is fed to the second electronic component 3 through the exposed part.

As shown in FIG. 2(a), where the heat-transfer branch portion 12b is extended in the horizontal direction (or equivalently, a direction from right to left in the drawing), the length of the heat-transfer path ranging from the recess 11b to the heat-transfer base portion 12a is reduced to a minimum, which helps suppress heat confinement in the recess 12b.

The top-side heat-transfer layer 13 covers, for example, the upper surface of the heat-transfer base portion 12a, and is thermally coupled to the upper surface of the heat-transfer base portion 12a. In the embodiment as shown in FIG. 2(a), the top-side heat-transfer layer 13 makes contact with the upper surface of the heat-transfer base portion 12a while being thermally coupled to the heat-transfer base portion 12a.

In a case where the top-side heat-transfer layer 13 is larger in area than the mounting region 11a as seen in a plan view, it is possible to improve the planarity of the part where the first electronic component 2 is to be mounted. The planarity improvement allows, where, for example, the first electronic component 2 is a light-emitting element, a lessening of unevenness in intensity distribution of light emitted from the first electronic component 2, with the consequence that the wiring board 1 is capable of implementation of an electronic device having improved light emission characteristics.

In a case where the top-side heat-transfer layer 13 is larger in area than the upper surface of the heat-transfer base portion 12a as seen in a plan view, it is possible to cover the boundary between the heat-transfer base portion 12a and the insulating substrate 11, and thereby prevent deterioration in the planarity of the mounting region 11a that may occur in the boundary due to their difference in level.

The top-side heat-transfer layer 13 is, so long as it makes contact with the upper surface of the heat-transfer base portion 12a, electrically connected to the heat-transfer base portion 12a, for serving as a path for the supply of reference voltage to the first electronic component 2.

The bottom-side heat-transfer layer 14 covers, for example, the lower surface of the heat-transfer base portion 12a, and is thermally coupled to the lower surface of the heat-transfer base portion 12a. In the embodiment as shown in FIG. 2(a), the bottom-side heat-transfer layer 14 makes contact with the lower surface of the heat-transfer base portion 12a while being thermally coupled to the heat-transfer base portion 12a.

In a case where the bottom-side heat-transfer layer 14 is larger in area than the heat-transfer base portion 12a as seen in a bottom view, it is possible to achieve enhancement in the electrical connection and thermal coupling of the heat-transfer base portion 12a to the mounting board.

The bottom-side heat-transfer layer 14 is, so long as it makes contact with the lower surface of the heat-transfer base portion 12a, electrically connected to the heat-transfer base portion 12a, for serving as a path for the supply of reference voltage to the first electronic component 2 and the second electronic component 3.

The first electronic component 2 is, for example, a light-emitting element, and, a light-emitting diode (LED) made of a semiconductor material is taken up as an example of the light-emitting element. In the case where the first electronic component 2 is a light-emitting element, the first electronic component 2 acts to emit primary light of a wavelength in, for example, an ultraviolet or blue region in response to a driving current.

The first electronic component 2 is mounted on the top-side heat-transfer layer 13, and is electrically connected to the top-side heat-transfer layer 13. Moreover, the first electronic component 2 is electrically connected to the top-side wiring conductor 17 by a bonding wire.

The first electronic component 2 receives supply of a reference voltage such for example as ground voltage GND via the top-side heat-transfer layer 13, and receives supply of a reference voltage such for example as power-supply voltage VDD via the top-side wiring conductor 17.

The second electronic component 3 is a protection element such for example as a Zener diode.

The second electronic component 3 is mounted on the heat-transfer branch portion 12b, and is electrically connected to the heat-transfer branch portion 12b. Moreover, the second electronic component 3 is electrically connected to the top-side wiring conductor 17 by a bonding wire.

The second electronic component 3 receives supply of a reference voltage such for example as ground voltage GND via the heat-transfer branch portion 12b, and receives supply of a reference voltage such for example as power-supply voltage VDD via the top-side wiring conductor 17.

The cover member 4 is disposed on the insulating substrate 11, for covering the first and second electronic components 2 and 3 and a plurality of bonding wires.

In a case where the electronic device of the present embodiment is a light-emitting device, the cover member 4 is made of a light-transmittable member, and, on an as need basis, a plurality of fluorescent particles dispersed in the light-transmittable member.

In the case where the electronic device of the present embodiment is a light-emitting device, the light-transmittable member is made of a resin material such for example as silicone resin. The plurality of fluorescent particles are excited by the primary light emitted from the first electronic component 2 (or equivalently, light-emitting element) so as to emit secondary light which is longer in wavelength than the primary light. For example, where the first electronic component 2 emits ultraviolet light, the secondary light has blue, green, and red wavelengths, and on the other hand, for example, where the first electronic component 2 emits blue light, the secondary light has a yellow wavelength.

It is noted that the cover member 4 may be designed to have a dome shape as shown in FIG. 2(b).

In the electronic device of the present embodiment, the wiring board 1 includes the heat-transfer member 12 placed so as to overlap the mounting region 11a for the first electronic component 2 and the recess 11b for the second electronic component 3 as seen in a plan view, and, part of the heat-transfer member 12 is exposed out of the insulating substrate 11 in the recess 11b. This makes it possible to eliminate heat in the recess 11b in an efficient manner, and thereby improve the operation characteristics of the second electronic component 3 disposed inside the recess 11b.

In a case where the electronic device of the present embodiment is, for example, a light-emitting device having a light-emitting element (for example, a light-emitting diode) and a protection element (for example, a Zener diode), and the first electronic component 2 is a light-emitting element and the second electronic component 3 is a protection element, then it is possible to remove heat which has been generated by the first electronic component 2 serving as a light-emitting element and transmitted to the interior of the recess 11b in an efficient manner, and thereby improve the operation characteristics of the second electronic component 3 serving as a protection element.

Moreover, where the electronic device of the present embodiment is a light-emitting device, the efficient removal of heat transmitted to the interior of the recess 11b helps suppress heat-induced deterioration in the quality of that part of the cover member 4 which finds its way into the recess 11b and nearby parts. So long as the heat-induced quality deterioration of the cover member 4 can be suppressed, it is possible to reduce loss of light emitted from the first electronic component 2 serving as a light-emitting element, and thereby improve the light emission characteristics of the electronic device serving as a light-emitting device.

Figure 4:
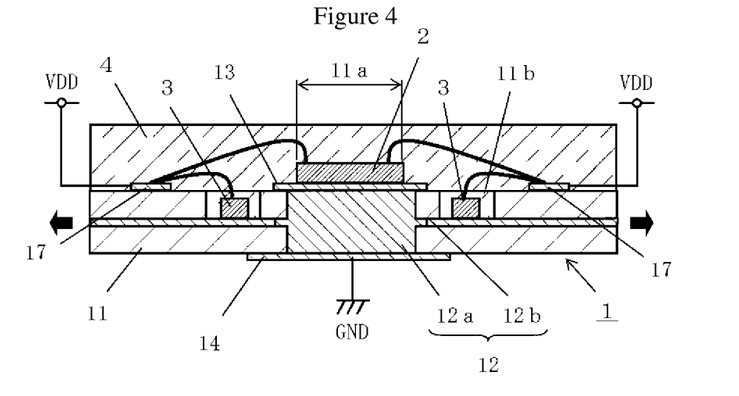
FIG. 4 is a schematic longitudinal sectional view related to a modified example of the electronic device as shown in FIG. 2.

As shown in FIG. 4, where the heat-transfer branch portion 12b is so disposed as to extend up to the lateral side of the insulating substrate 11, heat in the recess 11b is easily transmitted to the lateral side of the insulating substrate 11 via the heat-transfer branch portion 12b, wherefore heat dissipation from the lateral side of the insulating substrate 11 can be improved. In FIG. 4, heat dissipation at the lateral side of the insulating substrate 11 is schematically shown by block arrows.

Figure 5:
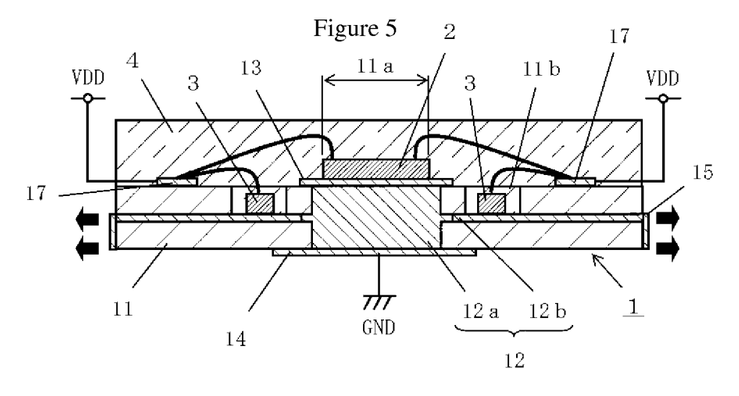
FIG. 5 is a schematic longitudinal sectional view related to a modified example of the electronic device as shown in FIG. 4.

Moreover, as shown in FIG. 5, where the wiring board 1 further includes a lateral-side heat-dissipating layer 15 disposed at the lateral side of the insulating substrate 11 while being thermally coupled to the heat-transfer branch portion 12b, heat dissipation at the lateral side of the insulating substrate 11 can be improved even further. In FIG. 5, heat dissipation at the lateral side of the insulating substrate 11 is schematically shown by block arrows.

Figure 6:
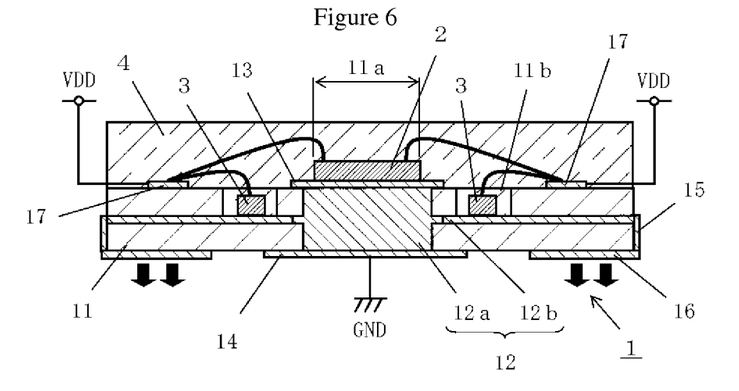
FIG. 6 is a schematic longitudinal sectional view related to a modified example of the electronic device as shown in FIG. 5.

Furthermore, as shown in FIG. 6, where the wiring board 1 additionally includes a bottom-side heat-transfer layer 16 (hereafter also referred to as "second bottom-side heat-transfer layer 16") disposed on the lower surface of the insulating substrate 11 while being thermally coupled to the lateral-side heat-dissipating layer 15, heat transmitted to the lateral-side heat-dissipating layer 15 can be efficiently conducted from the lower surface of the insulating substrate 11 to the mounting board. In FIG. 6, heat conduction at the lower surface of the insulating substrate 11 is schematically shown by block arrows.

Figure 7:
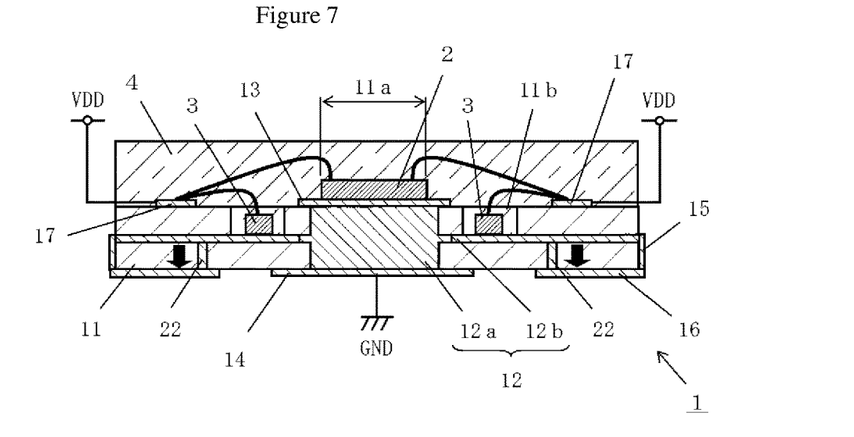
FIG. 7 is a schematic longitudinal sectional view related to a modified example of the electronic device as shown in FIG. 6.

Furthermore, as shown in FIG. 7, where the wiring board 1 further includes a via conductor 22 disposed inside the insulating substrate 11, for providing thermal coupling between the heat-transfer branch portion 12b and the bottom-side heat-transfer layer 16, heat in the heat-transfer branch portion 12b can be efficiently conducted to the lower surface of the insulating substrate 11. In FIG. 7, heat conduction by the via conductor 22 is schematically shown by block arrows.

It is noted that the technical idea of effecting heat conduction to the lower surface of the insulating substrate 11 by the via conductor 22 as shown in FIG. 7 is applicable to the structures as shown in FIG. 1 to FIG. 6.

Figure 8:
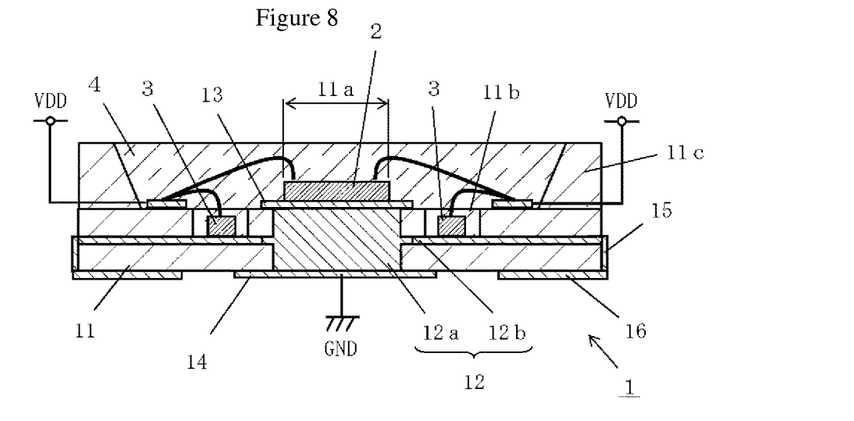
FIG. 8 is a schematic longitudinal sectional view related to a modified example of the electronic device as shown in FIG. 6.

Moreover, as shown in FIG. 8, in the wiring board 1, the insulating substrate 11 may be designed to include a frame portion 11c which surrounds the first electronic component 2. The technical idea as shown in FIG. 8 is applicable to the structures as shown in FIG. 1 to FIG. 7.

Figure 9:
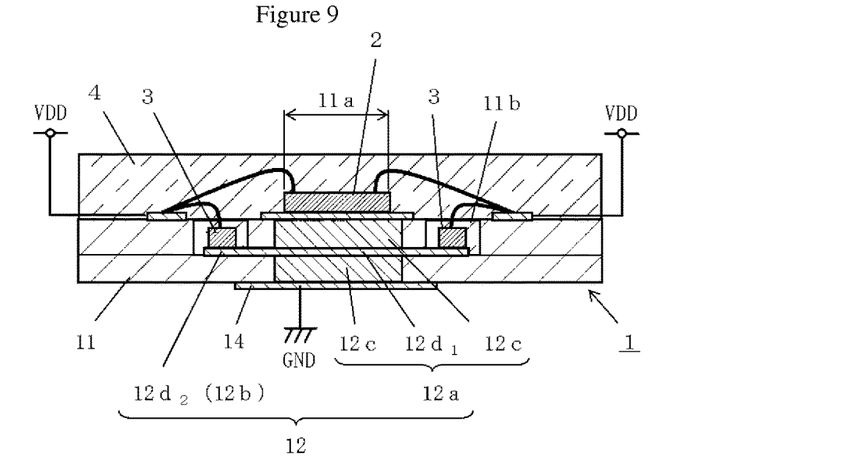
FIG. 9 is a schematic longitudinal sectional view related to an example of a layered structure of the electronic device as shown in FIG. 2.

Moreover, where the wiring board 1 of the present embodiment is implemented with use of a multi-layer ceramic board, the heat-transfer member 12 may be designed to have a layered structure as shown in FIG. 9.

The heat-transfer member 12 comprises a plurality of metal blocks 12c, and a metal layer 12d disposed so as to extend from the recess 11b to a region between the plural metal blocks 12c. In FIG. 9, the metal layer is represented by symbols 12d with a numeral added, namely $12d_1$, $12d_2$. That is, while the metal layer 12d may be formed in a one-piece design, a part thereof which is sandwiched between the plural metal blocks 12c is designated by the symbol $12d_1$, and a part thereof which is disposed so as to extend from the recess 11b is designated by the symbol $12d_2$.

The part corresponding to the heat-transfer base portion 12a shown in FIG. 2 and so forth is composed of the plural metal blocks 12c and one part of the metal layer 12d designated by the symbol $12d_1$. The part corresponding to the heat-transfer branch portion 12b shown in FIG. 2 and so forth is composed of one part of the metal layer 12d designated by the symbol $12d_2$.

It is noted that the layered structure as shown in FIG. 9 is applicable to the structures as shown in FIG. 1 to FIG. 8.

Figure 10:
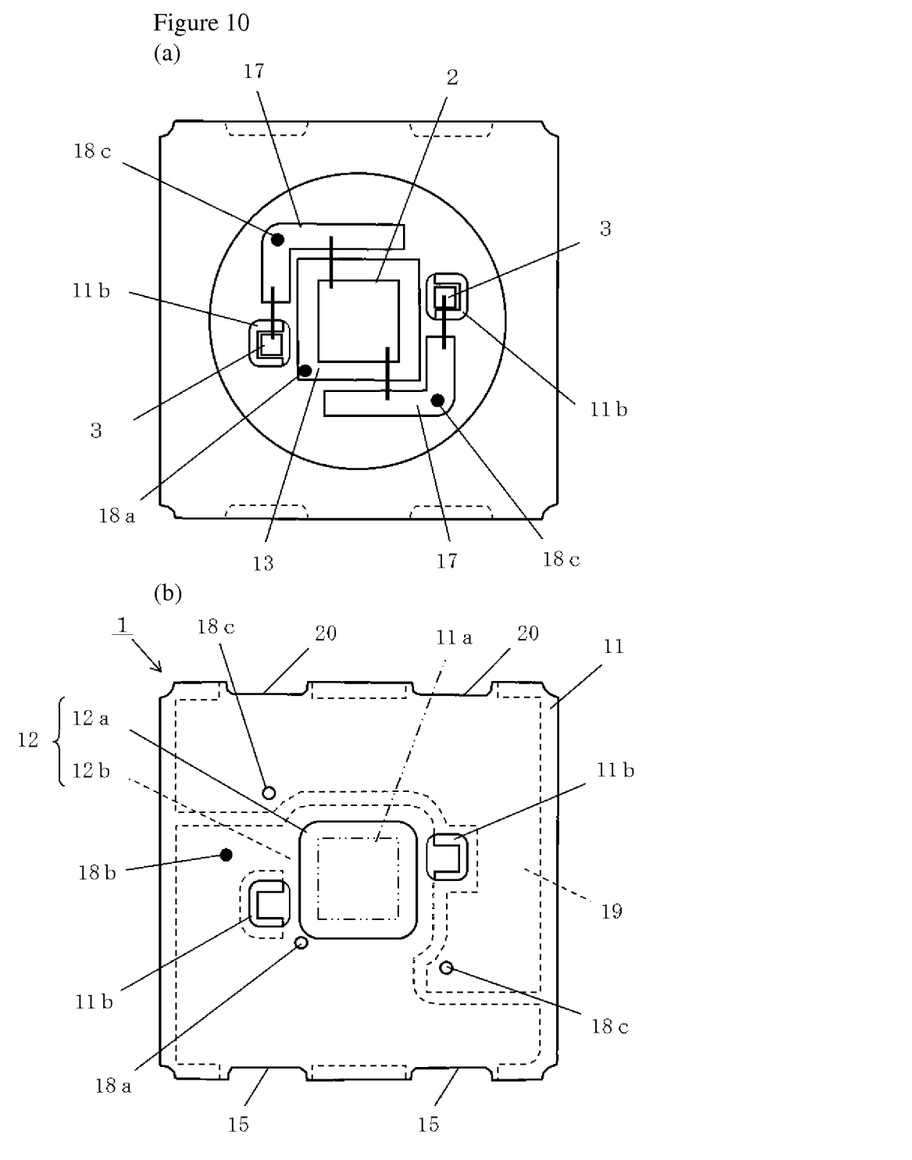
FIG. 10(a) is a plan view of an electronic device constructed by applying the technical ideas as to the layered structure as shown in FIG. 9 to the structural example as shown in FIG. 8.
FIG. 10(b) is a plan view showing the structure of the electronic device as shown in FIG. 10(a), with first and second electronic components, top-side heat-transfer layer, and top-side wiring conductor omitted.
Figure 11:
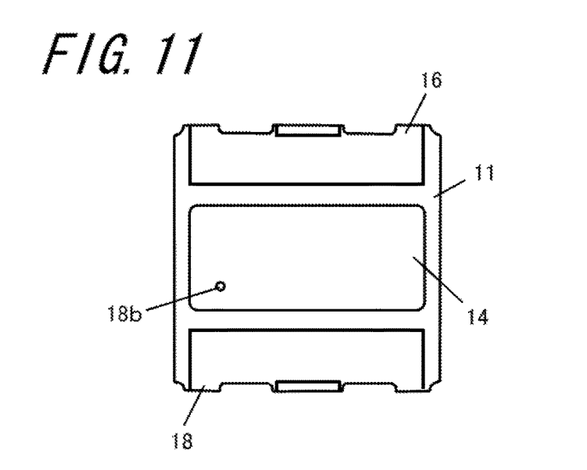
FIG. 11 is a bottom view of the electronic device as shown in FIG. 10(a) and FIG. 10(b)

Hereinafter, an example of applying the layered structure as shown in FIG. 9 to the structure as shown in FIG. 8, for example, will be described with reference to FIG. 10(a) to FIG. 12. In FIG. 10(a), FIG. 10(b), and FIG. 11, a filled circle represents the location of the upper end of the via conductor, and an open circle represents the location of the lower end of the via conductor.

As shown in FIG. 10(a), the first electronic component 2 (for example, a light-emitting element) is mounted on the top-side heat-transfer layer 13, and is electrically connected to the top-side wiring conductor 17 by a bonding wire. The first electronic component 2 is also electrically connected to the top-side heat-transfer layer 13. The top-side heat-transfer layer 13 receives supply of a reference voltage (for example, ground voltage GND), and the top-side wiring conductor 17 receives supply of a reference voltage (for example, power-supply voltage VDD). Accordingly, the first electronic component 2 receives reference-voltage supply (ground voltage GND and power-supply voltage VDD) via the top-side heat-transfer layer 13 and the top-side wiring conductor 17.

As shown in FIG. 10(a) and FIG. 10(b), the top-side heat-transfer layer 13 is electrically connected to the lower-located heat-transfer branch portion 12b by a via conductor 18a. As shown in FIG. 10(a) and FIG. 11, the heat-transfer branch portion 12b is electrically connected to the bottom-side heat-transfer layer 14 disposed on the lower surface of the insulating substrate 11 by a via conductor 18b. Moreover, the top-side heat-transfer layer 13 is electrically connected to the bottom-side heat-transfer layer 14 by the heat-transfer base portion 12a. The bottom-side heat-transfer layer 14 receives supply of a reference voltage (for example, ground voltage GND).

As shown in FIG. 10(a) and FIG. 10(b), the top-side wiring conductor 17 is electrically connected to a lower-located innerlayer wiring conductor 19 by a via conductor 18c. As shown in FIG. 10(b) and FIG. 11, the innerlayer wiring conductor 19 is electrically connected to a bottom-side wiring conductor 18 disposed on the lower surface of the insulating substrate 11 by a lateral-side wiring conductor 20 disposed on the lateral side of the insulating substrate 11. The bottom-side wiring conductor 18 receives supply of a reference voltage (for example, power-supply voltage VDD).

As shown in FIG. 10(a) and FIG. 10(b), the second electronic component 3 (for example, a protection element such as a Zener diode) is mounted on that part of the heat-transfer branch portion 12b which is exposed out of the insulating substrate 11 in the recess 11b, and is electrically connected to the top-side wiring conductor 17 by a bonding wire. The second electronic component 3 is also electrically connected to the heat-transfer branch portion 12b. The second electronic component 3 receives reference-voltage supply (ground voltage GND and power-supply voltage VDD) via the heat-transfer branch portion 12b and the top-side wiring conductor 17.

Figure 12:
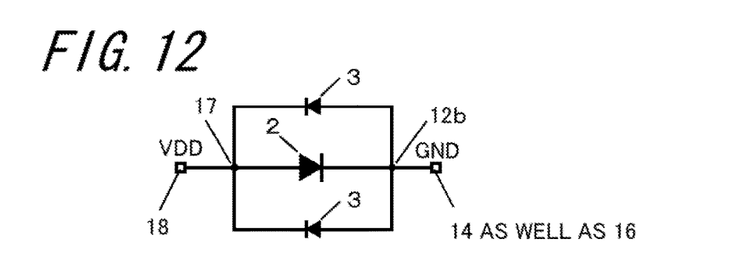
FIG. 12 shows the electrical connection configuration of the electronic device as shown in FIG. 10(a), FIG. 10(b), and FIG. 11.

The electrical connection configuration of the electronic device (for example, a light-emitting device) thus far described will be explained with reference to FIG. 12.

The first electronic component 2 (for example, a light-emitting element) and the second electronic component (for example, a protection element such as a Zener diode) are connected in parallel in a region between a node 17 (or equivalently, the top-side wiring conductor 17) and a node 12b (or equivalently, the heat-transfer branch portion 12b).

In a case where the first electronic component 2 is a light-emitting element such as a light-emitting diode, the first electronic component has its anode electrode electrically connected to the node 17, and has its cathode electrode electrically connected to the node 12b.

In a case where the second electronic component 3 is a protection element such as a Zener diode, the second electronic component 3 has its anode electrode electrically connected to the node 12b, and has its cathode electrode electrically connected to the node 17.

Figure 13:
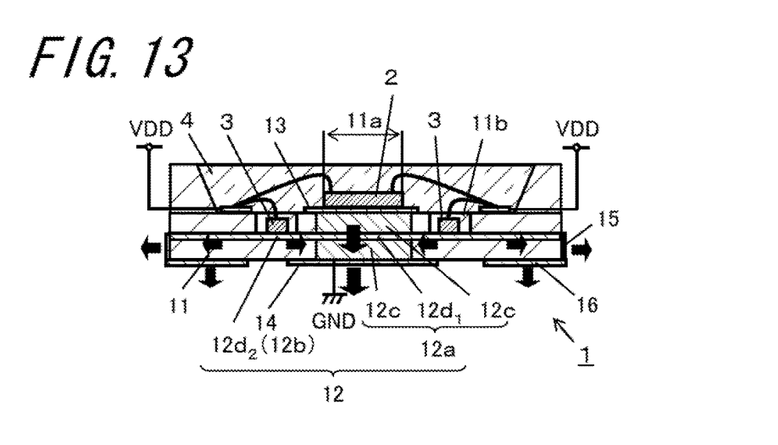
FIG. 13 is a schematic longitudinal sectional view of the electronic device as shown in FIG. 10(a), FIG. 10(b), and FIG. 11.

The node 17 is electrically connected to an external terminal 18 (or equivalently, the bottom-side wiring conductor 18), and the node 12b is electrically connected to external terminals 14 and 16 (or equivalently, the bottom-side heat-transfer layers 14 and 16). Heat conduction and dissipation in the electronic device as shown in FIG. 10(a) to FIG. 12 will be explained with reference to FIG. 13. In FIG. 13, how heat is to be conducted and dissipated is schematically shown by block arrows.

Heat generated by the first electronic component 2 is conducted, through the heat-transfer base portion 12a composed of the plural metal blocks 12c and the metal layer $12d_1$, to the bottom-side heat-transfer layer 14, and is then conducted from the bottom-side heat-transfer layer 14 to the mounting board.

Moreover, for example, heat which has been generated by the first electronic component 2 and transmitted to the recess 11b is conducted to the heat-transfer base portion 12a through the metal layer $12d_2$ (or equivalently, the heat-transfer branch portion 12b), and is also conducted to the lateral-side heat-dissipating layer 15 through the metal layer $12d_2$, and is then dissipated from the lateral-side heat-dissipating layer 15. Furthermore, part of the heat conducted to the heat-dissipating layer 15 is conducted to the bottom-side heat-transfer layer 16, and is then conducted from the bottom-side heat-transfer layer 16 to the mounting board.

Figure 14:
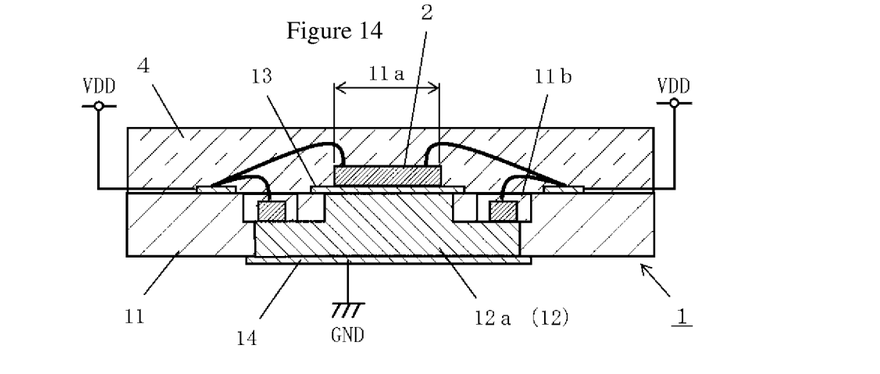
FIG. 14 is a schematic longitudinal sectional view related to another example of the electronic device as shown in FIG. 2.

By way of another structural example of the electronic device as shown in FIG. 2 and so forth, as shown in FIG. 14, there is a construction in which the heat-transfer member 12 includes the heat-transfer base portion 12a, and part of the heat-transfer base portion is exposed out of the insulating substrate 11 in the recess 11b. The heat-transfer base portion 12a is placed so as to overlap the mounting region 11a and the recess 11b as seen in a plan view.

Figure 15:
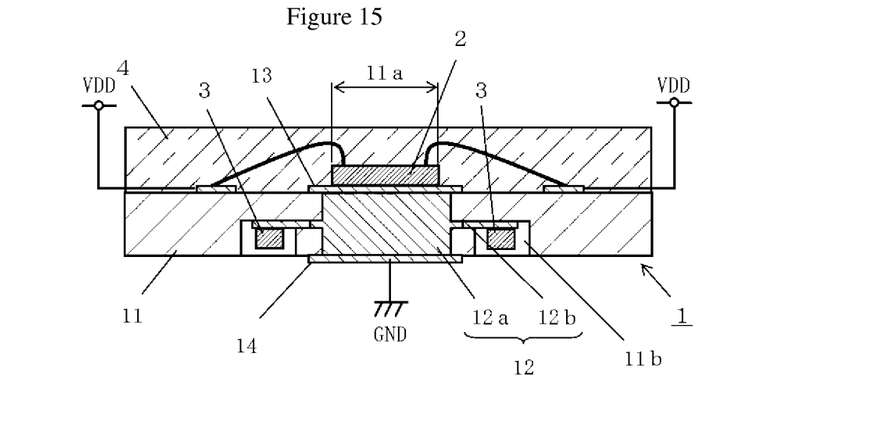
FIG. 15 is a schematic longitudinal sectional view related to another example of the electronic device as shown in FIG. 2.

Moreover, by way of still another structural example of the electronic device as shown in FIG. 2 and so forth, as shown in FIG. 15, there is a construction in which the recess 11b is formed in the lower surface of the insulating substrate 11.

In what follows, a case where the wiring board 1 as shown for example in FIG. 9 is made of ceramics will be described in further detail.

The insulating substrate 11 has an upper surface including the mounting region 11a for the first electronic component 2, and is shaped like a rectangular plate as seen in a plan view. The insulating substrate 11 serves as a support for supporting the first and second electronic components 2 and 3, and, the first electronic component 2 is fixedly bonded onto the mounting region 11a via a joining material such as a low melting-point brazing material or an electrically-conductive resin.

The material used for the insulating substrate 11 is ceramics such for example as sintered aluminum oxide (alumina ceramics), sintered aluminum nitride, or sintered mullite.

For example, where the insulating substrate 11 is made of sintered aluminum oxide, suitable organic binder, solvent, and so forth are admixed in raw material powder such as aluminum oxide, silicon oxide, magnesium oxide, and calcium oxide to prepare a slurry. The slurry is molded into sheet form by means of doctor blade technique, calender roll technique, or otherwise to obtain a ceramic green sheet. The ceramic green sheet is subjected to stamping process, and, a plurality of ceramic green sheets are stacked on top of each other in layers, and the layered body is fired at a high temperature (about 1300° C. to 1400° C.), whereby a wiring board 1 is produced.

The heat-transfer base portion 12a, which is intended to conduct heat generated by the first and second electronic components 2 and 3 mounted on the wiring board 1 in such a way that the heat can go out of the wiring board 1 for improvement in the heat dissipation capability of the electronic device, is embedded in the insulating substrate 11.

Moreover, for example, the heat-transfer base portion 12a has the shape of a rectangle with arcuately rounded corners or the shape of a circular cylinder as seen in a plan view. Note that the heat-transfer base portion 12a is larger in form than the first electronic component 2 as seen in a plan view. The heat-transfer base portion 12a contains copper tungsten (CuW) as a major constituent. As employed herein, a term "major constituent" refers to a predominant ingredient in the heat-transfer base portion 12a. Also in the following description, the term "major constituent" refers to a predominant ingredient.

The heat-transfer base portion 12a is produced by placing a metal sheet or metal paste which constitutes the heat-transfer base portion 12a in a hole created in the ceramic green sheets used for the insulating substrate 11 by means of punching using a die or punch, lasering, or otherwise, with subsequent firing process being performed.

Figure 16:
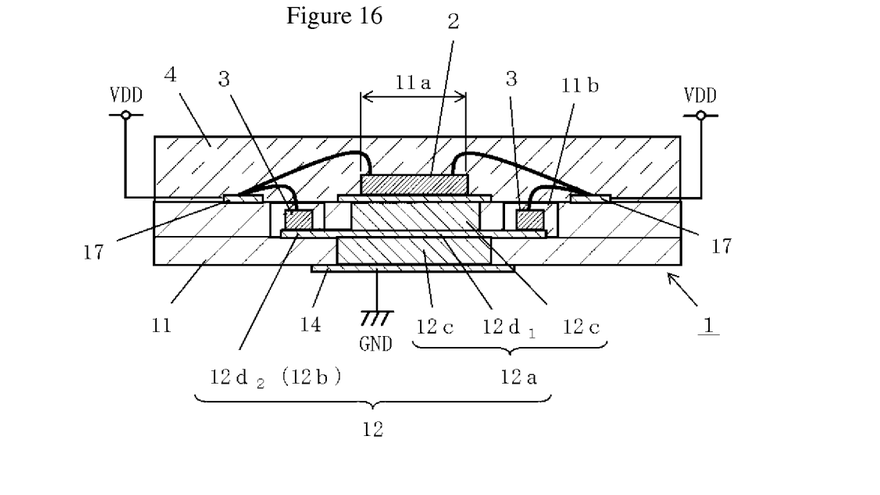
FIG. 16 is a schematic longitudinal sectional view related to another example of the electronic device as shown in FIG. 9.

As shown in FIG. 16, the heat-transfer base portion 12a may be configured so that the upper side and the lower side have different sizes as seen in a plan view to provide a stepped portion between them. This configuration is effective at securing a space for the placement of the top-side wiring conductor 17 on the upper surface of the insulating substrate 11.

The heat-transfer base portion 12a having such a structure is formed by creating a first through hole in the upper ceramic green sheet, creating a second through hole which is larger in diameter than the first through hole in the lower ceramic green sheet, embedding metal sheets or metal pastes of such size as to conform to their respective through holes, stacking the upper and lower ceramic green sheets on top of each other, and firing the stacked body.

In a case where, for example, a metal sheet is used to form such a heat-transfer base portion 12a, the metal sheet is identical in shape with the hole created in the ceramic green sheet used for the insulating substrate 11, and has a thickness equal to the depth of the hole of the ceramic green sheet. The metal sheet is embedded so as to fill up the hole of the ceramic green sheet.

It is noted that the simultaneous accomplishment of the embedment of the metal sheet and the punching of a hole in the ceramic green sheet makes it possible to produce a molded product in an efficient manner. For example, a metal sheet is placed on the upper surface of the ceramic green sheet used for the insulating substrate 11, followed by punching the metal sheet and the ceramic green sheet from the metal-sheet side with a die for punching a through hole in the ceramic green sheet, whereby a metal sheet part punched in the same size as the through hole from the metal sheet can be embedded in the through hole of the ceramic green sheet.

As to the method of producing such a metal sheet, the first step is to prepare a slurry by adding an organic binder and an organic solvent, and, on an as needed basis, predetermined amounts of plasticizer and dispersant in metal powder. The next step is to form the slurry into sheet form by applying it onto a support made of resin such as PET (polyethylene terephthalate) or paper by a forming method such as doctor blade technique, lip coater technique, or die coater technique. The last step is to dry the sheet product by a drying method such as hot-air drying technique, vacuum drying technique, or far-infrared drying technique.

As the metal powder, powder made of tungsten (W) and copper (Cu) is used. The metal power may either be of mixture form or alloy form. The use of a metal sheet made of a mixture of Cu powder and W powder makes it possible to attain a heat-transfer base portion 12a made of copper tungsten (CuW) which is excellent in heat dissipation capability.

The metal paste used for the heat-transfer base portion 12a is prepared by adding an organic binder and an organic solvent, and, on an as needed basis, dispersant and so forth in powder of the above-described metal adopted as a major constituent, and mixing and kneading the admixture by kneading means such as a ball mill, a three-roll mill, or a planetary mixer.

It is advisable that the organic binder for use in the metal paste used for the heat-transfer base portion 12a should be added in an amount of a level at which it can be readily decomposed and removed during firing process, and be able to disperse the metal powder, and, preferably, the organic binder is added in an amount of about 5% to 20% by mass based on the metal powder. The solvent is added in an amount of about 4% to 15% by mass based on the metal powder, and is adjusted in viscosity to fall in a range of about 15000 cps to 40000 cps.

It is noted that glass or ceramic powder may be added to the metal paste to ensure that it will conform to the ceramic green sheet in respect of firing shrinkage behavior or shrinkage factor during firing process, or to attain adequate joining strength of the wiring conductor 4 after firing process.

Moreover, where a metal paste is used as the metal material to form the heat-transfer base portion 12a, the metal paste is advisably subjected to viscosity adjustment so that it can be held in the hole of the ceramic green sheet, and, in this case, the hole of the ceramic green sheet is preferably formed as a recessed opening.

The heat-transfer branch portion 12b (or equivalently, the wiring conductor) is disposed inside the insulating substrate 12 so as to be connected to the heat-transfer base portion 12a, and is partly exposed out of the insulating substrate 12. That is, the heat-transfer branch portion 12b has an exposed part which is a part exposed out of the insulating substrate 12.

The heat-transfer branch portion 12b is intended to establish electrical connection between the first electronic component 2 and the second electronic component 3 mounted on the wiring board 1, or between the first and second electronic components 2 and 3 and an external circuit board. Note that the heat-transfer branch portion 12b may be connected to a land-pattern part of the heat-transfer base portion 12a.

Figure 17:
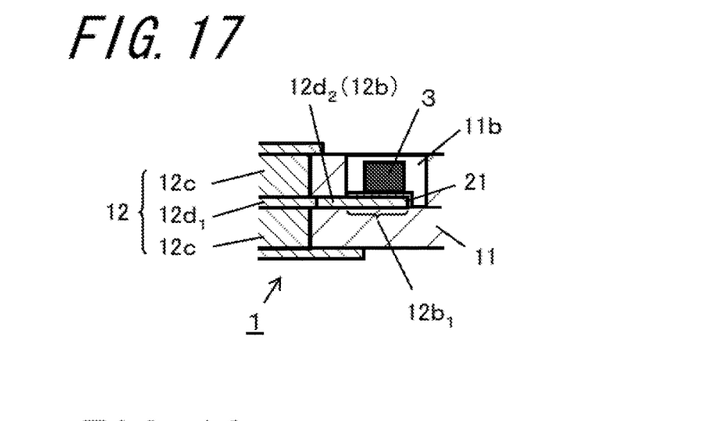
FIG. 17 is a schematic longitudinal sectional view showing an area around a recess of the electronic device as shown in FIG. 9 in detail.

Now, the structure of the part around the recess 11b will be described in further detail with reference to FIG. 17.

The heat-transfer base portion 12a contains, for example, CuW as a major constituent to reduce the difference in thermal expansion coefficient from the insulating substrate 11.

In the heat-transfer branch portion 12b, at least its exposed part $12b_1$ contains, for example, molybdenum (Mo) as a major constituent. The heat-transfer branch portion 12b may, in its entirety, contain molybdenum as a major constituent. In a case where the heat-transfer branch portion 12b (the exposed part $12b_1$, in particular) contains CuW as a major constituent, the copper component which has been melted during firing process is caused to move toward the heat-transfer base portion 12a. Since the tungsten component is difficult to be sintered at the temperature at which the wiring board 1 is fired, it follows that the strength of joining of the heat-transfer branch portion 12b (the exposed part $12b_1$, in particular) to the insulating substrate 11 decreases, which results in the possibility of separation of the heat-transfer branch portion 12b.

In this regard, it is preferable that, in the heat-transfer branch portion 12b, at least the exposed part $12b_1$ contains, as a major constituent, molybdenum which is sintered at the firing temperature for the wiring board 1.

Figure 18:
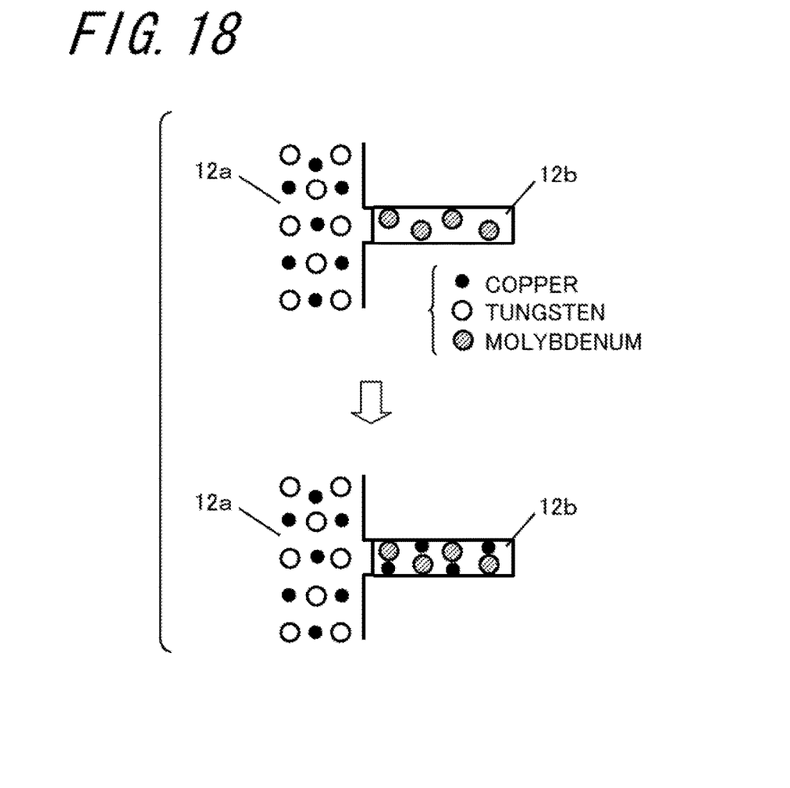
FIG. 18 is a schematic view showing a method to form a heat-transfer branch portion as shown in FIG. 17.

As schematically shown in FIG. 18, part of the copper component of the heat-transfer base portion 12a that has been melted during firing process finds its way into a gap between the molybdenum particles of the heat-transfer branch portion 12b. In consequence, the heat-transfer branch portion 12b, while containing molybdenum a major constituent, also has a copper content. The upper section of FIG. 18 shows a state where the copper component is yet to be melted, and the lower section thereof shows a state where the copper component has been melted.

The wiring board 1 further comprises a plating layer 21, which originates in the copper component of the heat-transfer branch portion 12b, formed on the surface of the heat-transfer branch portion 12b. Although it is generally difficult to form a plating layer which originates in the molybdenum component, in the presence of the copper component in the heat-transfer branch portion 12b, the plating layer 21 can be formed, with the copper component defined as its originating point.

The plating layer 21 is, for example, of a nickel plating layer having a thickness of about 1 to 10 μm and a gold plating layer having a thickness of about 0.1 to 3 μm. By virtue of the inclusion of the plating layer 21, in the wiring board 1, the heat-transfer branch portion 12b can be protected against corrosion, and the strength of joining of the second electronic component 3 can be increased.

Figure 19:
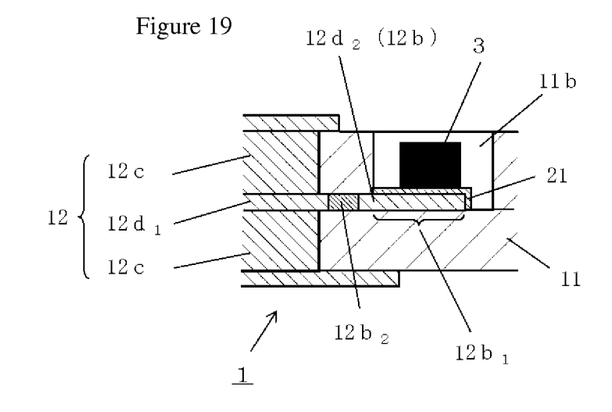
FIG. 19 is a schematic longitudinal sectional view related to another example of the heat-transfer branch portion as shown in FIG. 17.

By way of another structural example of the case where the plating layer 21 can be easily formed in the exposed part $12b_1$ of the heat-transfer branch portion 12b, as shown in FIG. 19, the exposed part $12b_1$ may be designed to contain CuW as a major constituent. Thus, the plating layer 21 is formed, with the Cu component of the exposed part $12b_1$ defined as its originating point.

In this structural example, with the contact between the CuW component of the exposed part $12b_1$ and the CuW component of the heat-transfer base portion 12a, when the Cu component of the exposed part $12b_1$ is melted, the molten Cu component will be caused to move toward the heat-transfer base portion 12a, thereby bringing the exposed part $12b_1$ to a state of containing tungsten as a major constituent, with the consequent decrease in the strength of joining with the insulating substrate 11. It is therefore desirable to interpose a barrier portion $12b_2$ between the exposed part $12b_1$ and the heat-transfer base portion 12a.

It is sufficient that the barrier portion $12b_2$ serves the purpose of suppressing copper-component movement in the state where the CuW components of different portions make contact with each other, and thus, for example, the barrier portion $12b_2$ may be designed to contain molybdenum as a major constituent, or contain tungsten as major constituent.

Although the sintering of tungsten contained in the exposed part $12b_1$ becomes difficult depending on the firing temperature for the wiring board 1, since the copper component is present in a gap between tungsten components, it is possible to secure sufficient strength of joining with the insulating substrate 11.

REFERENCE SIGNS LIST

1: Wiring board
11: Insulating substrate
12: Heat-transfer member
  12a: Heat-transfer base portion
  12b: Heat-transfer branch portion
13: Top-side heat-transfer layer
14: Bottom-side heat-transfer layer
15: Lateral-side heat-dissipating layer
16: Bottom-side heat-transfer layer
17: Top-side wiring conductor
2: First electronic component
3: Second electronic component
4: Cover member

The invention claimed is:

1. A wiring board, comprising:
an insulating substrate which comprises an upper surface and a recess formed in the upper surface, the upper surface comprising a first mounting region for a first electronic component, and a second mounting region for a second electronic component which is provided in the recess; and
a heat-transfer member disposed inside the insulating substrate so as to overlap the first mounting region and the second mounting region as seen in a plan view, part of the heat-transfer member being exposed in the recess,
wherein the heat-transfer member comprises a heat-transfer base portion located inside the insulating substrate so as to overlap the first mounting region as seen in a plan view, and a heat-transfer branch portion disposed inside the insulating substrate so as to extend from the heat-transfer base portion to the second mounting region,
wherein the heat-transfer base portion contains copper tungsten as a major constituent,
wherein the heat-transfer branch portion contains molybdenum as a major constituent and contains copper as another constituent, and
wherein the heat-transfer branch portion in the second mounting region is coated with a plating layer, and the heat-transfer branch portion includes a barrier portion, which suppresses copper movement towards the heat-transfer base portion, between the heat-transfer base portion and a region of the heat-transfer branch portion where the plating layer coats the heat-transfer branch portion.

2. The wiring board according to claim 1, wherein part of the heat-transfer branch portion is exposed on a lateral side of the insulating substrate.

3. The wiring board according to claim 2, further comprising:
a lateral-side heat-transfer layer disposed on the lateral side of the insulating substrate so as to make contact with the heat-transfer branch portion.

4. The wiring board according to claim 3, further comprising:
a bottom-side heat-transfer layer disposed on a lower surface of the insulating substrate so as to make contact with the lateral-side heat-transfer layer.

5. The wiring board according to claim 1, wherein the heat-transfer base portion is comprised of a plurality of metal blocks which are vertically arranged, and wherein the heat-transfer branch portion is so disposed as to extend up to a region between the metal blocks that are adjacent to each other.

6. The wiring board according to claim 1, wherein the heat-transfer member comprises a heat-transfer base portion placed so as to overlap the first mounting region and the second mounting region as seen in a plan view, and wherein part of the heat-transfer base portion is exposed in the recess.

7. An electronic device, comprising:
the wiring board according to claim 1;
a first electronic component disposed on the first mounting region; and a second electronic component disposed on the second mounting region.

8. An electronic device, comprising:
the wiring board according to claim 2;
a first electronic component disposed on the first mounting region; and
a second electronic component disposed on the second mounting region.

9. The wiring board according to claim 1, wherein the barrier portion includes molybdenum as a major constituent or includes tungsten as major constituent.

* * * * *